United States Patent
Reinmuth et al.

(10) Patent No.: US 11,975,964 B2
(45) Date of Patent: May 7, 2024

(54) METHOD FOR MANUFACTURING A MICROELECTROMECHANICAL STRUCTURE AND MICROELECTROMECHANICAL STRUCTURE

(71) Applicant: Robert Bosch GmbH, Stuttgart (DE)

(72) Inventors: Jochen Reinmuth, Reutlingen (DE); Ralf Boessendoerfer, Dinkelsbuehl (DE)

(73) Assignee: ROBE IT BOSCH GMBH, Stuttgart (DE)

( * ) Notice: Subject to any disclaimer, the term of this patent is extended or adjusted under 35 U.S.C. 154(b) by 452 days.

(21) Appl. No.: 17/446,245

(22) Filed: Aug. 27, 2021

(65) Prior Publication Data

US 2022/0081286 A1 Mar. 17, 2022

(30) Foreign Application Priority Data

Sep. 9, 2020 (DE) ..................... 10 2020 211 313.0

(51) Int. Cl.
  *B81C 1/00* (2006.01)
(52) U.S. Cl.
  CPC .... *B81C 1/00476* (2013.01); *B81C 2201/013* (2013.01)
(58) Field of Classification Search
  CPC .......... B81C 1/00476; B81C 2201/013; B81C 2201/0133; B81C 1/00198; G01C 19/5769; G01P 15/0802; G01P 15/125; B81B 3/0086; B81B 2201/0235; B81B 2201/0242; B81B 7/02
  See application file for complete search history.

(56) References Cited

U.S. PATENT DOCUMENTS

2015/0054101 A1\* 2/2015 Reinmuth ............. B81B 3/0078
257/420

FOREIGN PATENT DOCUMENTS

| DE | 4241045 C1 | 5/1994 |
| DE | 4317274 A1 | 12/1994 |
| DE | 19537814 A1 | 4/1997 |
| DE | 102011080978 A1 | 2/2013 |
| DE | 102017219901 B3 | 1/2019 |

\* cited by examiner

*Primary Examiner* — J. E. Schoenholtz
(74) *Attorney, Agent, or Firm* — NORTON ROSE FULBRIGHT US LLP; Gerard A. Messina (57) ABSTRACT

A method for manufacturing a microelectromechanical structure. The method includes: forming a first and a second functional layer including recesses, a third functional layer, and three insulating layers situated therebetween, a structured lateral area of the third functional layer defining a movable structure, the insulating layers and the first and second functional layers each including a lateral area situated beneath the structured lateral area of the third functional layer and corresponding to a perpendicular projection of the structured lateral area; etching the insulating layers to remove the lateral area of the third insulating layer, and expose the movable structure, all recesses of the first functional layer situated in the lateral area of the first functional layer being formed by narrow trenches, the first functional layer being formed to include an electrically insulated segment in the lateral area which is separated from the remainder of the first functional layer by trenches.

10 Claims, 8 Drawing Sheets

METHOD FOR MANUFACTURING A
MICROELECTROMECHANICAL
STRUCTURE AND
MICROELECTROMECHANICAL
STRUCTURE

FIELD

The present invention relates to a method for manufacturing a microelectromechanical structure and to a microelectromechanical structure.

BACKGROUND INFORMATION

Methods for manufacturing micromechanical sensors, such as, e.g., acceleration and rotation rate sensors, are available in the related art in numerous forms and variants. For example, German Patent Application No. DE 195 37 814 A1, German Patent No. DE 42 41 045 C1, and German Patent No. DE 43 17 274 A1 describe methods by which movable silicon structures may be generated, whose movements are measured by determining capacitance changes. It is characteristic of this class of methods that, in a first step, the movable silicon structures are generated from a thick functional layer by an etching method, during which the functional layer is structured by trenches having a high aspect ratio. In a second step, a sacrificial layer beneath the functional layer is removed, yielding structures which are freely movable with respect to the base. Additionally, a thin, buried functional layer made up of polysilicon may be situated beneath the movable structures, which serves, for example, as a suspension for the movable or fixed silicon structures or may be used as an electrode or strip conductor. The movable structures are usually hermetically sealed with the aid of a cap. The cap wafer may be applied onto the sensor wafer using different bonding methods, a cavity being usually provided in the cap.

It is important for this manufacturing method that the thickness of the sacrificial layer is selected to be considerably larger than the thickness of the buried functional layer since otherwise the movable structures, during a horizontal deflection, would strike against the edges of the first buried polysilicon layer. The disadvantage of these methods, however, is that, even in the case of small thicknesses of the buried silicon layer, the topography is always formed at the underside of the movable layer, i.e., the topographic structure of the polysilicon layer exerts an influence on the structure, formed during etching, at the underside of the movable structure so that, in this way, differences in height, unevennesses, protrusions and other defects may arise at the underside (see FIG. 1). This effect is, in particular, critical for rotation rate sensors. In the case of rotation rate sensors, a movable mass is typically excited to carry out a horizontal oscillating movement, and a vertical deflection effectuated by the Coriolis force is detected via capacitance changes. Whenever a movable structure passes over an edge of a buried electrode surface, the capacitance between the movable structure and the electrode changes due to the topography at the underside of the movable structure. This results in an interference signal having double the frequency of the oscillation. This interference signal makes it considerably more difficult to correctly evaluate the rotation rate signal and should absolutely be avoided.

Furthermore, a method is described in German Patent Application No. DE 10 2011 080 978 A1 with the aid of which the buried polysilicon layer may be manufactured in such a way that, during etching, no topographic defects arise in the layers situated thereabove, and thus a striking of the movable structures against the edges of the buried polysilicon layer is avoided. The advantage of this method is furthermore that, in addition to avoiding such striking, also the aforementioned interference signals may be avoided. The disadvantage of this method, however, is that it is more complex, and the manufacturing costs are accordingly higher. Another disadvantage is that cavities arise in the sacrificial layer with this method in locations at which a buried polysilicon surface is provided, which directly affect the sacrificial layer etching since the etching takes place in a considerably accelerated manner in the area of the cavities. Even though this may be utilized, on the one hand, to achieve a strong undercutting locally, this, at the same time, limits the options for controlling the undercutting in areas in which no buried polysilicon layer is provided.

Modern rotation rate sensors usually use two buried polysilicon layers beneath the movable functional layer, the first buried layer usually being used purely as a strip conductor. In the process, the second buried polysilicon layer serves as a counter electrode surface for the movable structures or as a suspension or potential feed for the movable structures. The second polysilicon layer may also serve as a strip conductor and/or as a shielding structure (shield), with the aid of which electrostatic potentials between the movable structures and the strip conductors in the first buried polysilicon layer may be shielded, so that undesirable forces on the movable structures are avoided. In such arrangements, all buried polysilicon surfaces are usually placed at a defined potential to ideally generate a vanishing potential difference, at which no undesirable forces act on the movable structure, or to create additional control options in the form of defined forces on the movable structure via a defined potential difference. In contrast, electrically insulated surfaces without defined potential, i.e., with floating potential, are not used, since this may result in uncontrolled and changing forces on the movable masses. Furthermore, the fact that the distance between the second buried polysilicon layer and the substrate is very large is deliberately used to advantage, when the interposed first buried polysilicon layer includes recesses in certain areas. In this way, large counter electrode surfaces may be generated in the second polysilicon layer toward the movable structure, which have an accordingly high capacitance, but which, despite the large surface, have a small capacitance with respect to the substrate due to the large distance. By reducing the parasitic capacitances compared to the useful capacitances, very sensitive sensors may be built.

Figure 4A:
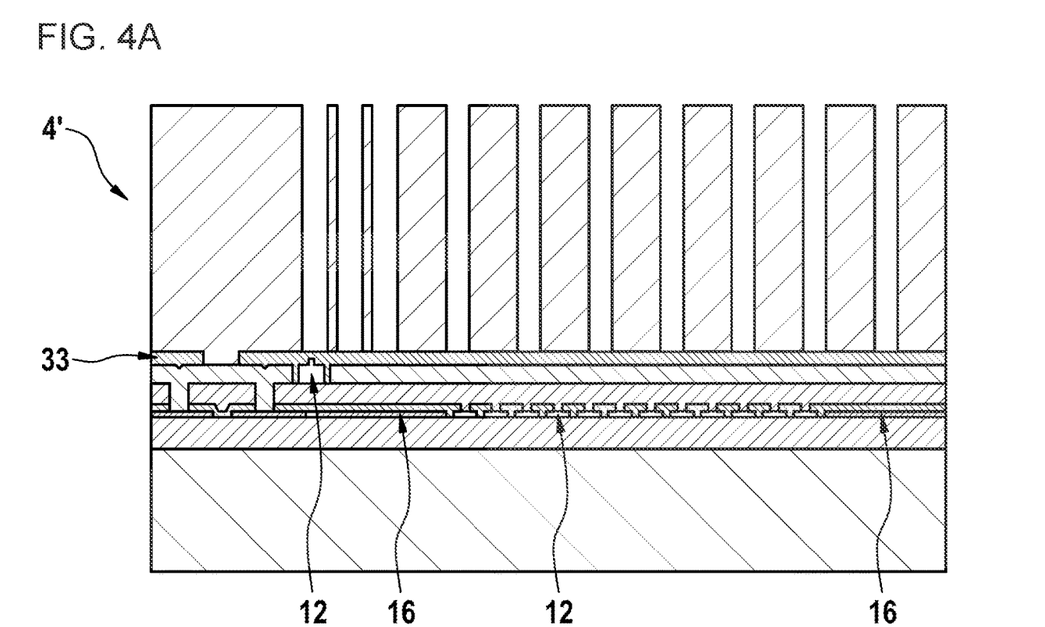
FIGS. 4A and 4B illustrate the problems which occur with a conventional method from the related art during the structuring of the first functional layer.
Figure 4B:
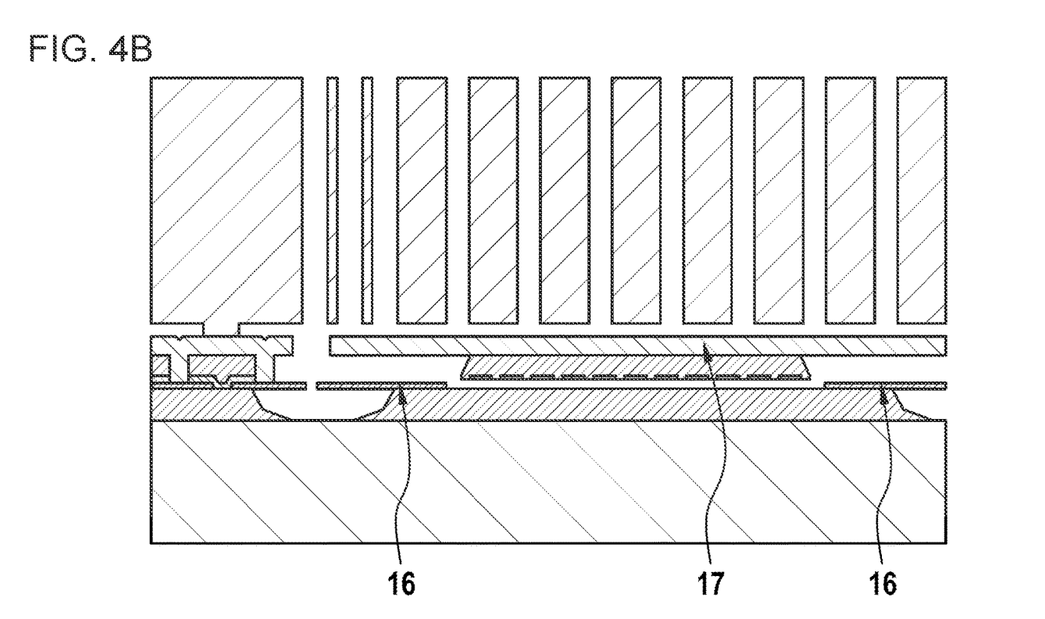

The manufacturing method described in German Patent Application No. DE 10 2011 080 978 A1 may, in principle, also be individually employed for both buried polysilicon layers, however this makes the manufacture very expensive and complex. In addition, the further disadvantage arises that employing the method twice is not possible for arbitrary buried polysilicon structures. To generate an electrode surface having low parasitic capacitance in the second buried polysilicon plane, a first buried polysilicon layer also always has to be provided in an edge area, to prevent the entire electrode surface from being undercut during the sacrificial layer etching (see FIG. 4). The edge structure in the first buried polysilicon layer now increases the parasitic capacitance of the electrode surface due to its smaller distance. During the manufacture, the edge area thus has to be selected to be as narrow as possible, by which, however, the risk arises that the entire electrode surface is undercut in the event of fluctuations in the sacrificial layer etching.

SUMMARY

It is an object of the present invention to provide a manufacturing method by which a movable structure may be manufactured on a substrate including two or more buried functional layers. In the process, the manufacturing process should be as simple as possible and generate as little topography as possible at the underside of the movable structures. Further objectives are to keep the parasitic capacitances as low as possible, and to create an arrangement which is stable with respect to fluctuations in the sacrificial layer etching.

A feature of an example embodiment of the present invention is to avoid the topographical defects at the underside of the movable structure through the interplay of two different measures. On the one hand, only sufficiently narrow trenches are provided in the first functional layer, which do not generate any defects at the underside of the movable structures during etching. To also enable this special design for large surfaces beneath the movable structure, without increasing their contribution to the parasitic capacitance due to the accordingly large surface of the first functional layer, insulated segments ("dummy surfaces") are furthermore provided, which are floatingly connected to the remainder of the microelectromechanical structure.

The main extension plane of the substrate and the direction perpendicular thereto are assumed as the reference system for the description of the geometric conditions. The directions in parallel to the main extension plane are also referred to hereafter as lateral directions, and the perpendicular or vertical direction shall always be assumed to mean the direction perpendicular to the substrate. The first, second, and third insulating layers and the first, second, and third functional layers each extend, in particular, in parallel to the substrate and are situated vertically on top of one another, it being possible for one or multiple additional auxiliary layer(s) to be selectively situated between the second insulating layer and the second functional layer, or the third insulating layer and the third functional layer. The lateral area of the third functional layer of which the movable structure is formed by structuring is referred to hereafter as the structured lateral area and corresponds to the lateral extension of the movable structure formed by structuring and exposure (i.e., etching of the third insulating layer situated therebeneath). The method according to the present invention is aimed at minimizing the influence of the topography of the first functional layer on the underside of the movable structure situated vertically thereabove. The area of an (insulating or functional) layer situated vertically beneath the movable structure (or beneath the structured lateral area of the third functional layer) is referred to as the lateral area of the particular layer and corresponds to the perpendicular projection of the structured lateral area onto the particular layer. The design according to the present invention of the first functional layer, including narrow trenches and at least one dummy segment, always refers exclusively to the lateral area of the first functional layer since only this area is able to exert an influence on the underside of the movable structure situated perpendicularly thereabove. The functional layers may be made up of polysilicon, for example, while silicon oxide, for example, may be used as the material for the insulating layers.

The method in accordance with an example embodiment of the present invention may have the advantage over the related art that the influence of the topography of the first functional layer on the underside of the movable structure generated by etching is suppressed. In addition, the design according to the present invention reduces the sensitivity with respect to manufacturing fluctuations during the sacrificial layer etching process, and the manufacturing process overall becomes more robust. The following descriptions always refer to an individual movable structure, however the method may also be used to manufacture microelectromechanical structures including multiple movable masses by accordingly generalizing the design according to the present invention of the lateral area of the first functional layer to two or more areas, which are each situated beneath one of the movable structures.

As a result of the etching, the third insulating layer (sacrificial layer) beneath the structured lateral area of the third functional layer is completely removed, so that the movable structure is exposed in this way, and, in particular, is mounted oscillatorily with respect to at least one lateral direction. During this etching process, portions of the second and third insulating layers and of possibly present auxiliary layers are also removed. Since, in the process, the topography of the first functional layer influences the local etching at the underside of the movable structure being exposed, the idea according to the present invention provides configuring the topography in such a way that this influence is as low as possible. Since the effect is, in particular, heavily dependent on the size of the recesses in the first functional layer and is more pronounced in the case of larger recesses, it is provided according to the present invention to exclusively design the recesses in the lateral area of the first functional layer in the form of narrow trenches. In the process, the width is selected to be smaller than twice the perpendicular distance between the first and third functional layers, i.e., smaller than twice the sum of all layer thicknesses of the layers (second and third insulating layers, second insulating layer, and optional auxiliary layers) situated between the first and third functional layers. As a result of the selection of this ratio between lateral width and perpendicular distance, it is advantageously achieved that no topographical defects are formed at the underside of the movable structures during etching. It is also possible to design the trenches to be even narrower, for example having a width that corresponds to the distance between the first and third functional layers or even only to the thickness of the first functional layer. Since this design principle drastically limits the size of the recesses in the first functional layer, it must additionally be avoided that larger portions of the first functional layer which do not have any direct function (for example, in the form of a controlled electrostatic coupling to other components of the structure) contribute to an increase in the parasitic capacitances. Instead of removing these portions of the first functional layer, it is provided according to an example embodiment of the present invention to electrically insulate them from the remainder of the first functional layer by narrow trenches, so that these "dummy segments" have a floating potential during operation of the sensor, and the parasitic effects are reduced in this way.

The method according to the present invention furthermore allows multiple advantageous refinements, which are disclosed herein.

According to one preferred specific embodiment of the present invention, the width of the trenches in the lateral area of the first functional layer is greater than half the thickness of the first functional layer. In this way, the formation of cavities may advantageously be avoided during the deposition of the second insulating layer. It is also possible that at least one trench in the lateral area of the first functional layer has a width which is greater than half the thickness of the first functional layer, so that, for example, the formation of cavities may be deliberately avoided in particularly critical areas. It is also possible that at least one further trench in the lateral area of the first functional layer has a width which is smaller than half the thickness of the first functional layer.

According to one further preferred specific embodiment of the present invention, the second functional layer is formed in such a way that it includes at least one first and one second segment, and the two segments are electrically insulated from one another, the first functional layer being formed in such a way that it includes a first and a second electrically insulated segment, which are separated from one another and from the remainder of the functional layer by trenches, the first segment of the first functional layer being situated beneath the first segment of the second functional layer, and the second segment of the first functional layer being situated beneath the second segment of the second functional layer. In particular, the first and second segments of the second functional layer may be situated adjoining one another and, e.g., be separated from one another by a recess. In this specific embodiment, the dummy areas of the first functional layer are segmented as a function of the potentials of the structures situated thereabove. In this way, it may advantageously be avoided that the first and second segments of the second functional layer couple to one another via dummy segments of the first functional layer, and that parasitic capacitances between them may be generated.

According to one further preferred specific embodiment of the present invention, the first functional layer is formed in such a way that it includes a shielding segment in the lateral area, which is separated from the remainder of the first functional layer by trenches, the shielding segment being situated beneath a recess of the second functional layer and conductively connected to at least one segment of the second functional layer. In this specific embodiment, at least one shielding structure, which is at a defined potential to shield forces on the movable structure caused by stray fields of the dummy surfaces of the first buried functional layer, is provided in the first functional layer at particularly critical edge areas between two segments of the second functional layer. In particular, the shielding structures in the first functional layer (as viewed from the substrate) cover the recess of the second functional layer so that in this way, in particular, shielding toward the substrate is ensured in the case of wide recesses.

According to one further preferred specific embodiment of the present invention, the first functional layer is formed in such a way that it includes a first and second shielding segment in the lateral area, which are situated in surroundings beneath a recess of the second functional layer, the first shielding segment being conductively connected to a first segment of the second functional layer, and the second shielding segment being conductively connected to a second segment of the second functional layer. In particular, the shielding structures thus formed are situated beneath an edge of the recess of the second functional layer, so that in this way a particularly narrow shielding structure having low parasitic capacitance toward the substrate is advantageously made possible. This is, in particular, a trench-shaped recess of the second functional layer, and the two shielding segments are situated symmetrically to one another beneath the two edges of the trench-shaped recess. This approach is, in particular, advantageous for narrow openings in the second polysilicon layer.

According to one particularly preferred specific embodiment of the present invention, the recesses in the second functional layer are formed by the following substeps: forming trenches in the second functional layer, which extend across the entire thickness of the second functional layer, the trenches subsequently being filled through the formation of a first auxiliary layer; forming etching accesses in the first auxiliary layer, which partially expose the second functional layer, subareas of the second functional layer being removed as a result of subsequent etching, and the etching accesses being closed by the third insulating layer prior to the formation of the third functional layer, the first auxiliary layer being at least partially removed during the etching of the third insulating layer. In particular, the etching of the third insulating layer takes place via the etching accesses, the filled trenches and the third insulating layer acting as an etching stop. In this specific embodiment, in particular, the method described in German Patent Application No. DE 10 2011 080 978 A1 is employed to form the recesses in the second functional layer, without the recesses thus generated forming defects at the underside of the movable structure during etching. For further details for carrying out the method, reference is made here to German Patent Application No. DE 10 2011 080 978 A1.

According to one preferred specific embodiment of the present invention, subareas of the first insulating layer and of the second insulating layer are removed during etching in such a way that a remaining subarea of the first insulating layer forms a base structure for the first insulated segment of the first functional layer, and a remaining subarea of the second insulating layer forms a base structure for a segment of the second functional layer. Subareas of the first and second insulating layers may also be removed in a similar manner in such a way that in each case a base structure for first segments of the first or second functional layer is created and, analogously, base structures for second segments of the two functional layers are formed.

According to one further preferred specific embodiment of the present invention, at least one strip conductor is formed by the first functional layer and/or at least one electrode, in particular a detection electrode, is formed by the third functional layer.

Another object of the present invention is to provide a microelectromechanical structure. The structure according to an example embodiment of the present invention may, in particular, be manufactured using one specific embodiment of the method according to the present invention, and the advantages and specific embodiments shown with respect to the method transfer themselves directly to the microelectromechanical structure according to the present invention. In particular, the second functional layer may include at least one first and one second segment, the two segments being electrically insulated from one another, the first functional layer including a first and a second electrically insulated segment, which are separated from one another and from the remainder of the functional layer by trenches, the first segment of the first functional layer being situated beneath the first segment of the second functional layer, and the second segment of the first functional layer being situated beneath the second segment of the second functional layer.

Further advantageous specific embodiments of the present invention are derived from the figures and the associated description herein.

DETAILED DESCRIPTION OF EXAMPLE EMBODIMENTS

Figure 1:
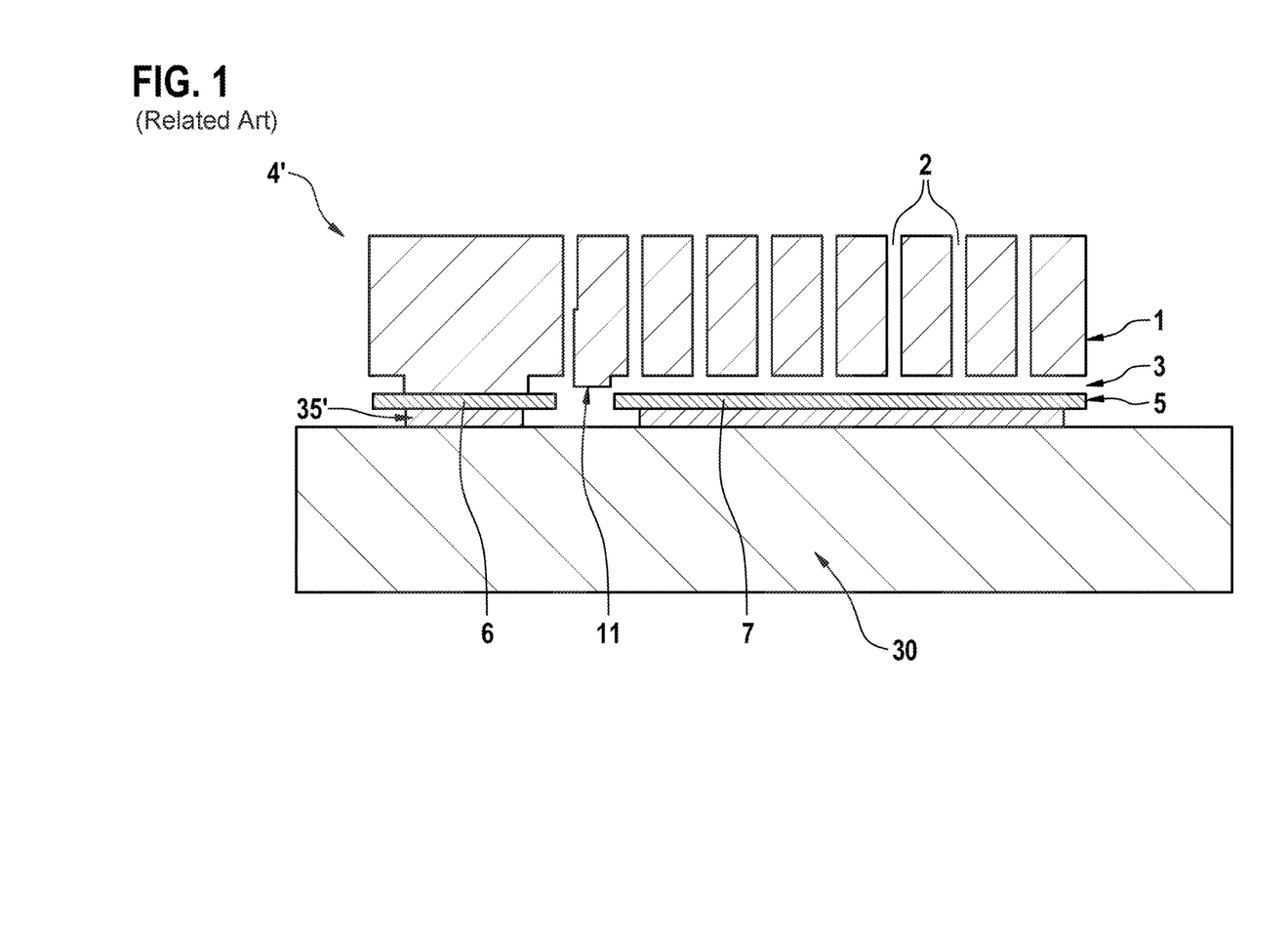
FIG. 1 schematically shows a conventional microelectromechanical structure from the related art.

FIG. 1 shows a microelectromechanical structure 4' from the related art. The structure is formed by a layer sequence on substrate 30, the uppermost layer being formed by a thick functional layer made up of silicon, which is designed into a movable silicon structure 1 by generating trenches 2 having a high aspect ratio (see German Patent No. DE 42 41 045 C1). The layer immediately therebeneath is removed by etching so that movable structure 1 is exposed by clearance 3 thus created (see German Patent No. DE 4317274 A1) and is freely movable with respect to the base. A thin, buried polysilicon layer 5, which is separated from substrate 30 by an insulating layer 35', is situated beneath movable structure 1 on substrate 30. This functional layer 5 may be used as suspension 6 for the movable or fixed silicon structures or may be used as electrode 7 beneath movable structures 1.

The recesses by which functional layer 5 is structured now result in the disadvantageous effect that, at this location, local topography defects 11 arise at the underside of movable structure 1 during etching (illustrated here based on the recess between components 6 and 7, which generate defect 11). When movable structure 1 passes over an edge of electrode surface 7, the capacitance between movable structure 1 and fixed counter-electrode 7 changes due to topography 11 at the underside of movable structure 11. The interference signal associated therewith distorts the actual measuring signal and should therefore absolutely be avoided.

Figure 2:
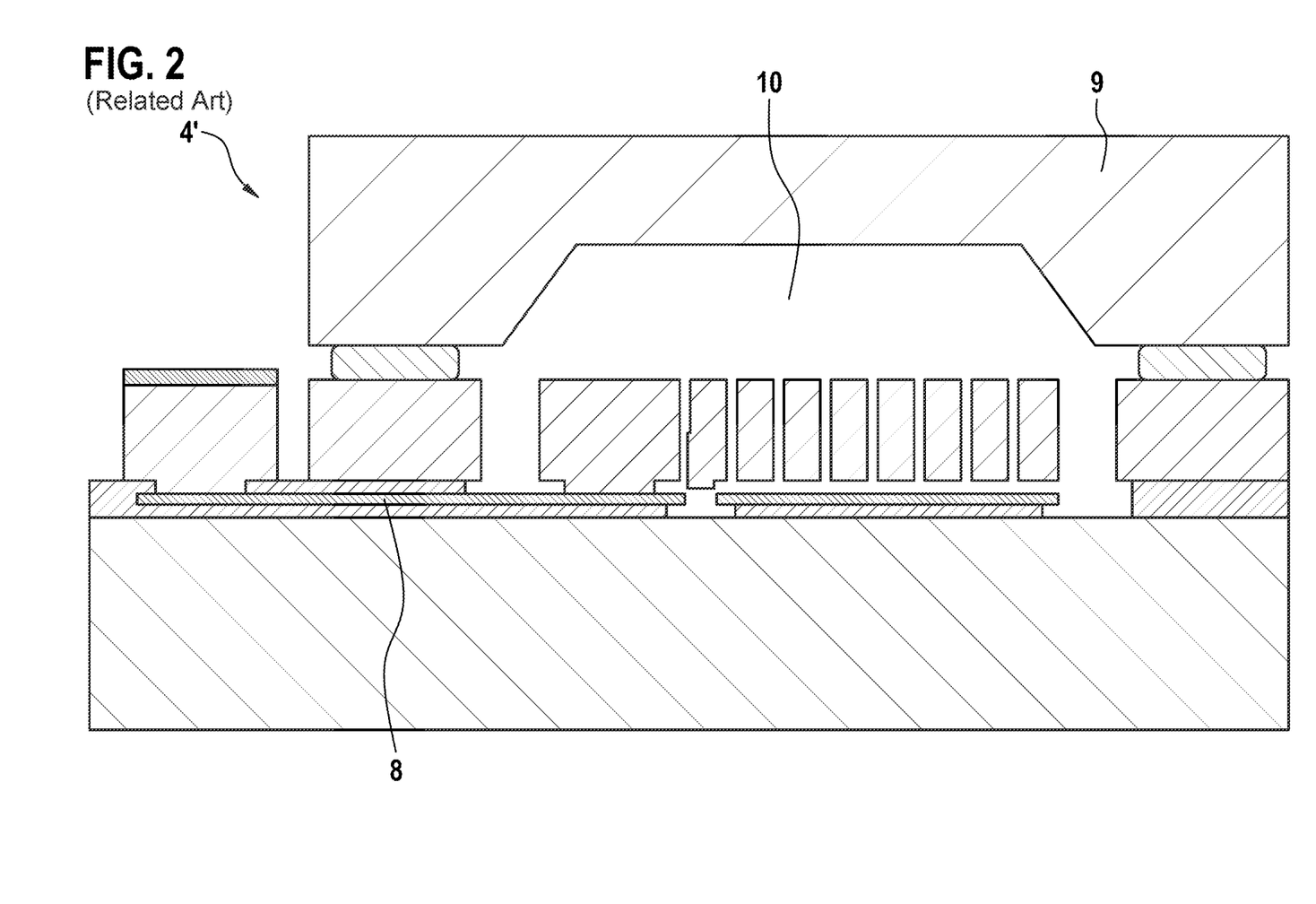
FIG. 2 schematically shows a conventional microelectromechanical structure including a cap from the related art.

In FIG. 2, the shown microelectromechanical structure 4' is hermetically sealed by a cap 9. Cap wafer 9 may be applied onto the sensor wafer with the aid of different bonding methods, a cavity 10 usually being provided in cap 9. First functional layer 5 above substrate 30 is designed as strip conductor 8 in this specific embodiment.

Figure 3:
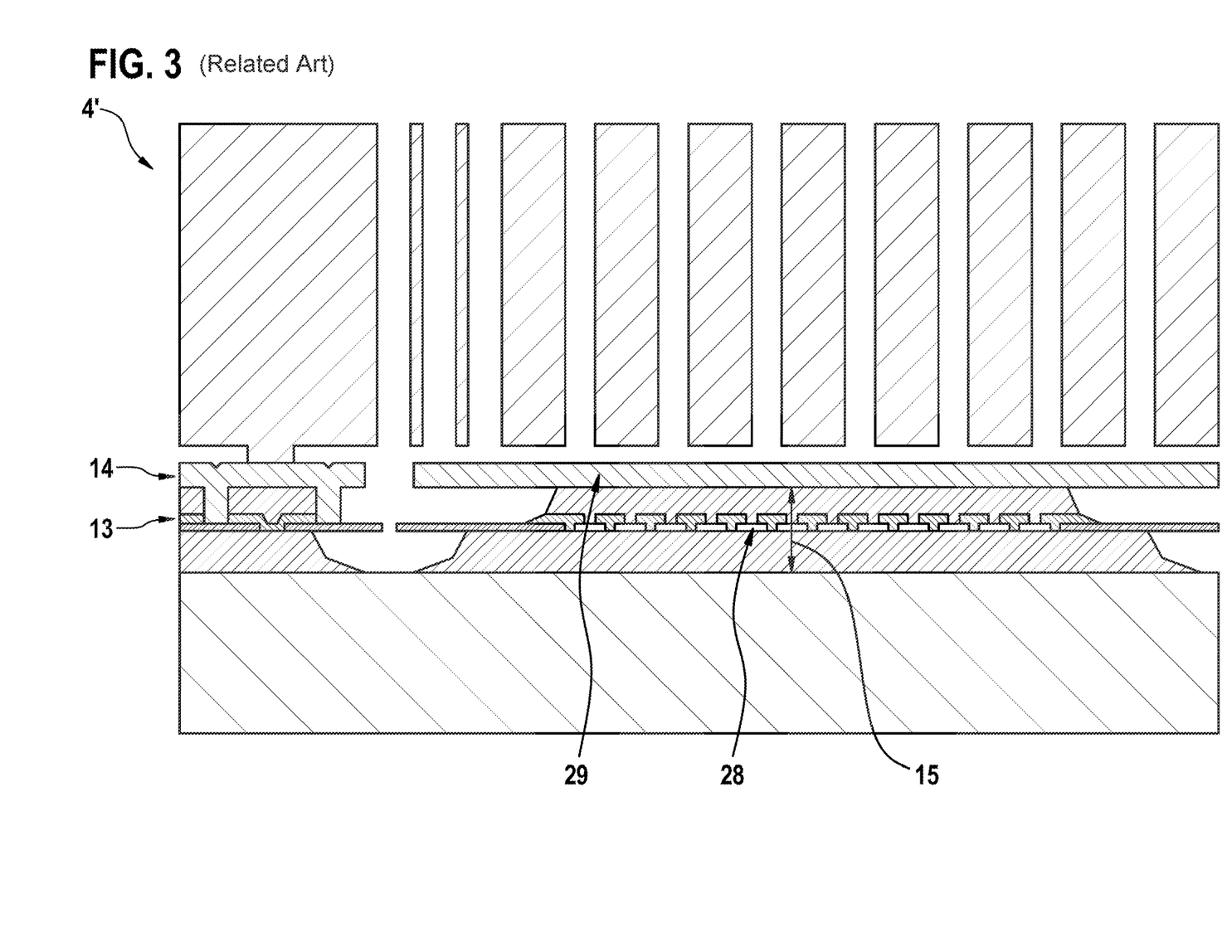
FIG. 3 shows a microelectromechanical structure whose first functional layer was structured using a conventional method from the related art.

FIG. 3 illustrates another option for structuring the layers situated beneath movable structure 1. The first buried layer serves purely as strip conductor 13 here. Subareas of second buried polysilicon layer 14 may serve as counter-electrode surface 29 toward movable structures 1, as suspension and potential feed for movable structures 1, as a strip conductor, and also as a shield, to shield potentials between movable structures 1 and strip conductors 13 in the first buried polysilicon layer. Recess 28 in the first buried layer, which is situated beneath counter-electrode 29, was formed here with the aid of the method described in German Patent Application No. DE 10 2011 080 978 A1. At this location, relatively high parasitic capacitances may potentially occur between electrode 29 and substrate 30, however here the fact that distance 15 between second buried polysilicon layer 14 and substrate 30 is very large in subarea 28 is used to advantage here, so that the parasitic capacitances are only low.

FIGS. 4A and 4B illustrate the disadvantage of the method from German Patent Application No. DE 10 2011 080 978 A1 that employing the method twice (i.e., individually for both functional layers) is not possible without restrictions. In this method, cavities 12 shown in FIG. 4A are created, which drastically accelerate the etching in these areas. To generate an electrode surface 17 having low parasitic capacitance in the second buried polysilicon plane, a first buried polysilicon layer also always has to be provided in an edge area 16, to prevent the entire electrode surface 17 from being undercut during the sacrificial layer etching. Edge structure 16 in the first buried polysilicon layer now increases the parasitic capacitance of electrode surface 17 due to its smaller distance. Even though this may be avoided by selecting edge area 16 as narrow as possible, however the risk arises that the entire electrode surface 17 is undercut in the event of fluctuations in the sacrificial layer etching, as is illustrated by way of example in FIG. 4B.

Figure 5:
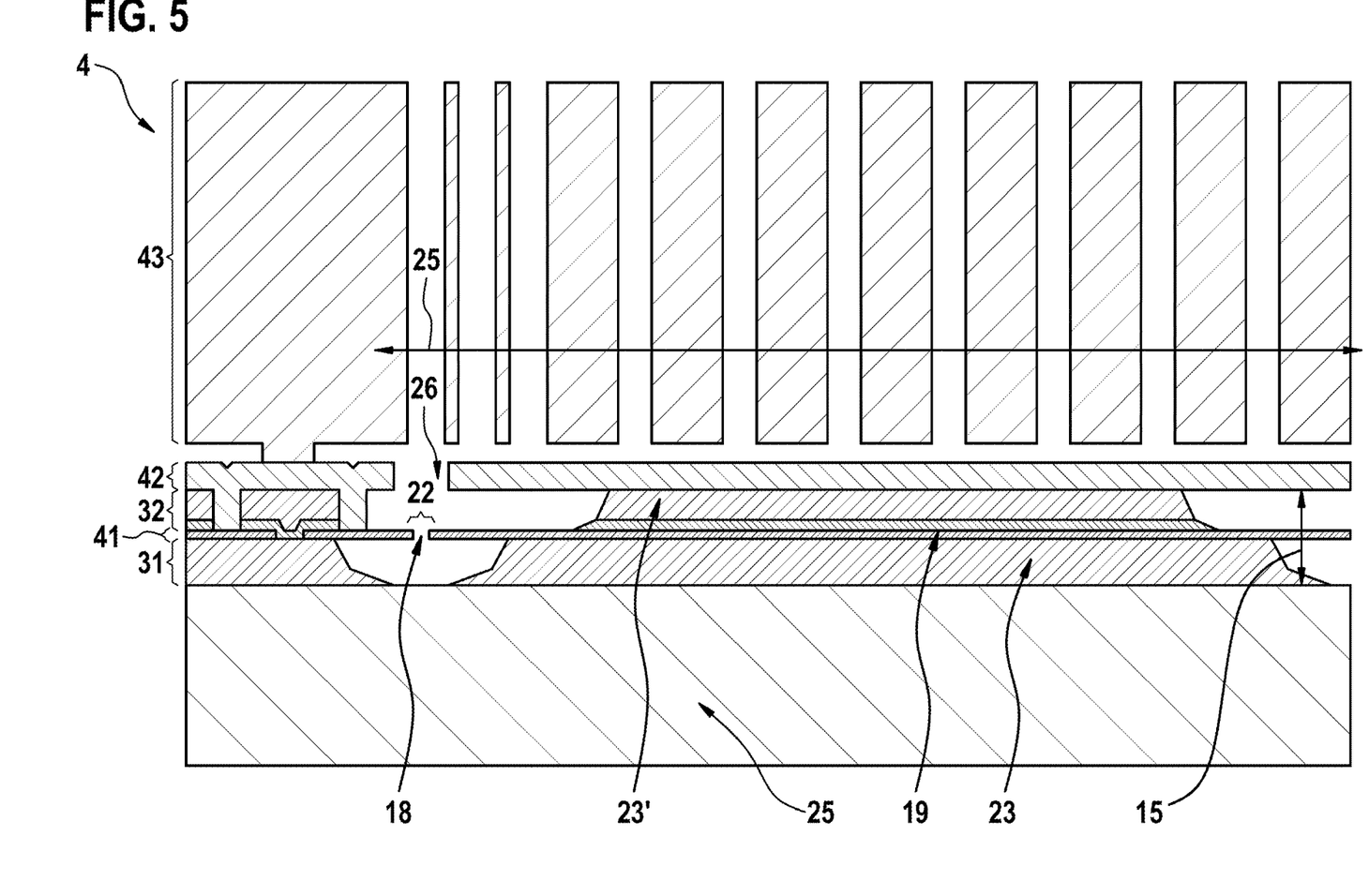
FIG. 5 schematically shows one specific embodiment of the microelectromechanical structure according to the present invention.

FIG. 5 shows one specific embodiment of microelectromechanical structure 4 according to the present invention. The layer sequence on substrate 30 is made up of a first insulating layer 31, a first functional layer 41, a second insulating layer 32, a second functional layer 42, an insulating layer 33 (which has already been removed here), and a third functional layer 43. A lateral area 25 of third functional layer 43 is designed into a movable structure 1. To avoid topographical defects 11 at the underside of movable structure 1 during etching, certain design principles are employed in the layers situated therebeneath, which reduce this effect. In the process, only those layer areas may influence the structure of the underside of movable structure 1 which are situated perpendicularly beneath movable structure 1 and which, geometrically speaking, correspond to the perpendicular projection of structured lateral area 25 onto the particular layer. The particular area is referred to as a lateral area of the associated layer. According to the present invention, it is provided that recesses 18 in the lateral area of first functional layer 41 are formed by narrow trenches 18, whose width 22 is smaller than twice distance 15 between first and third functional layers 41, 43. In addition, an electrically insulated segment 19 is provided in lateral area 15 of first functional layer 41, which is separated from the remainder of first functional layer 41 by trenches 18, and in this way forms a "dummy surface" which has a floating potential. In the case of the shown specific embodiment, additionally subareas of first and second insulating layers 31, 32 are removed during etching in such a way that a remaining subarea 23 of first insulating layer 31 forms a base structure 23 for first insulated segment 19 of first functional layer 41, and a remaining subarea 23' of second insulating layer 32 forms a base structure 23' for a segment 20 of second functional layer 42.

Figure 6:
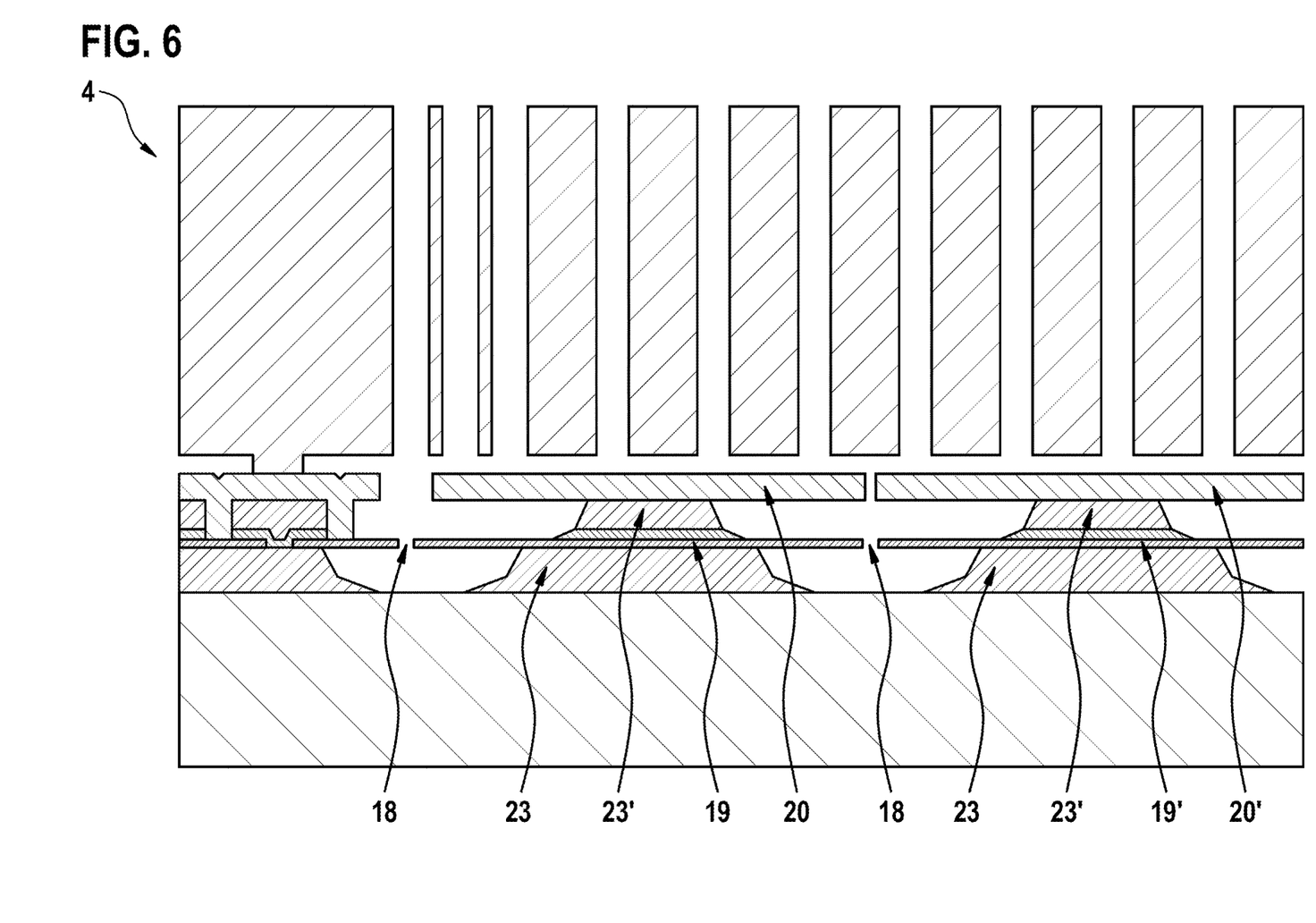
FIG. 6 schematically shows one further specific embodiment of the microelectromechanical structure according to the present invention.

In FIG. 6, the electrode includes two separate segments 20, 20' which are at different potentials. First functional layer 41 is segmented as a function of these potentials and accordingly divided into two segments 19, 19'.

Figure 7:
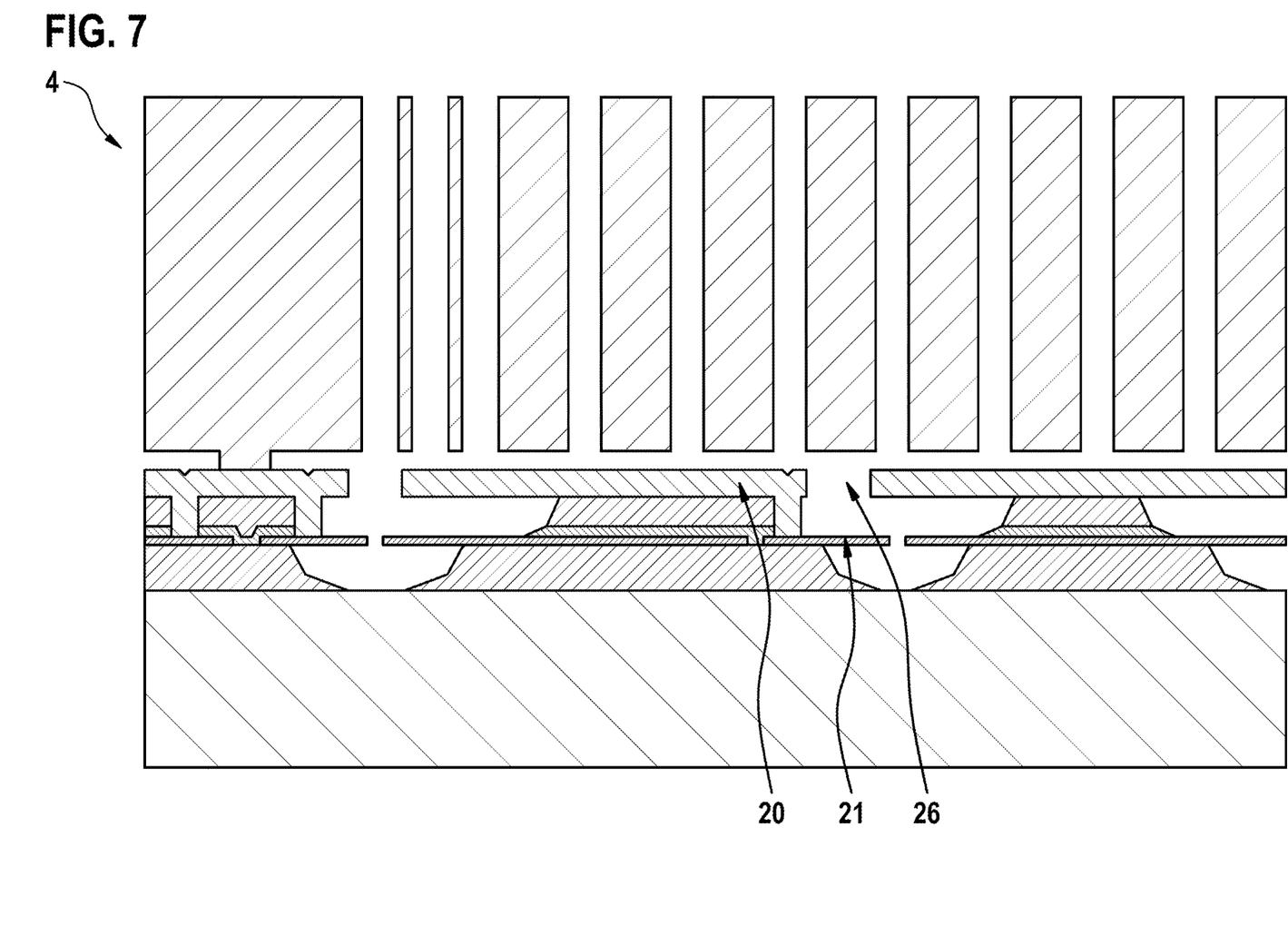
FIG. 7 schematically shows one specific embodiment of the microelectromechanical structure according to the present invention including shielding structures.

In FIG. 7, functional layer 41 includes a shielding segment 21 in the lateral area, which is separated from the remainder of first functional layer 41 by trenches 18. In the process, shielding segment 21 is situated beneath recess 26 of second functional layer 42 and conductively connected to at least one segment 20 of second functional layer 42. In the process, shielding segment 21 forms a shielding structure, which covers opening 26 and is at a defined potential, so that a shielding toward substrate 30 is ensured.

Figure 8:
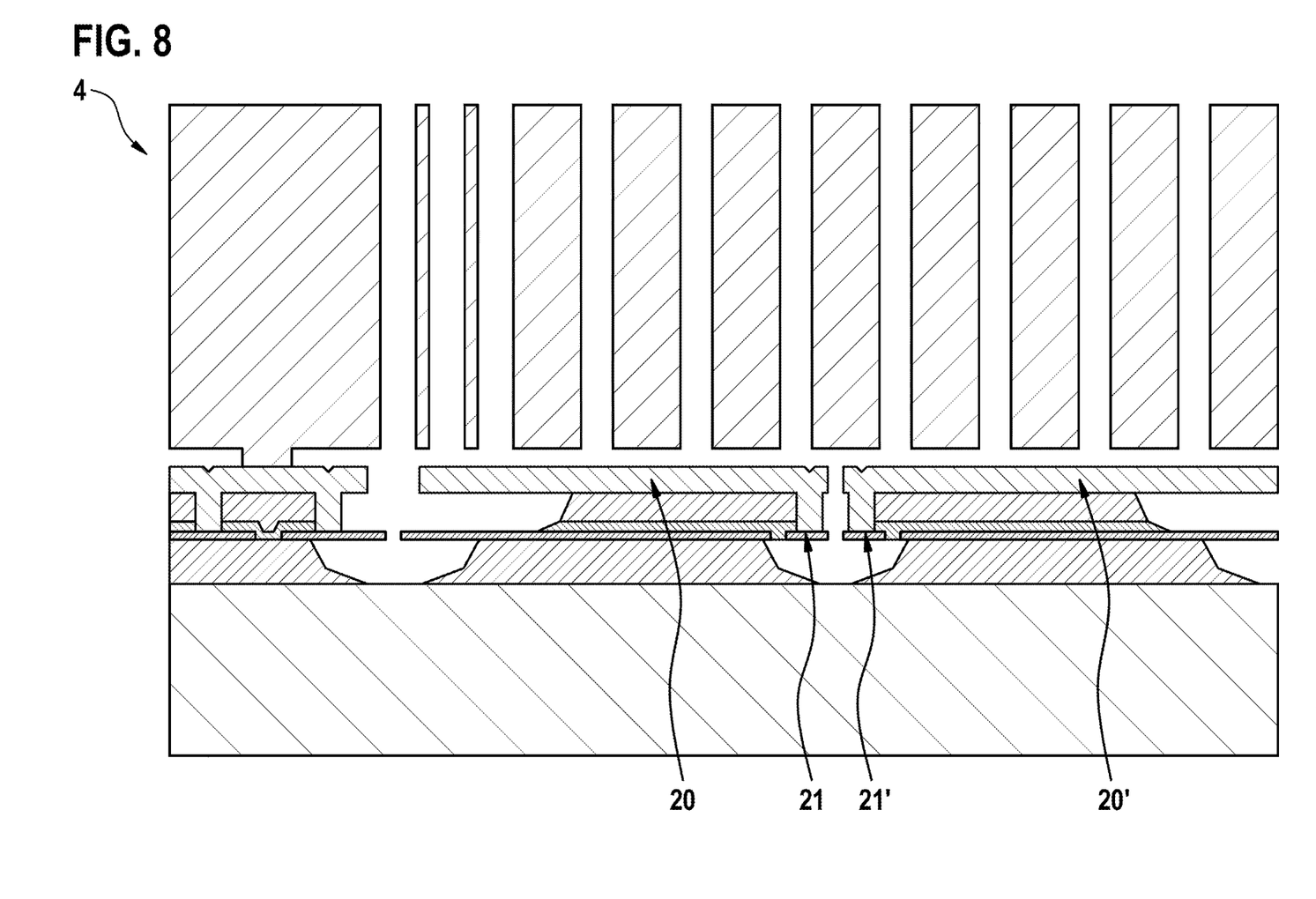
FIG. 8 schematically shows one further specific embodiment of the microelectromechanical structure according to the present invention including shielding structures.

Shielding segments 21, 21' which are symmetrically situated on both sides, and thus enable a particularly narrow shield structure having low parasitic capacitance toward substrate 30, are favorable for narrow openings in second functional layer 42, as is shown in FIG. 8. In the process, first shielding segment 21 is conductively connected to a first segment 20 of second functional layer 42, and second shielding segment 20' is conductively connected to a second segment 20' of second functional layer 42.

What is claimed is:

1. A method for manufacturing a microelectromechanical structure, the method comprising:
    forming at least one first insulating layer above a substrate;
    forming a first functional layer on the first insulating layer the first functional layer being provided with recesses which extend across an entire thickness of the first functional layer;
    forming a second insulating layer on the first functional layer;
    forming a second functional layer above the second insulating layer, the second functional layer being provided with recesses which extend across an entire thickness of the second functional layer;
    forming a third insulating layer above the second functional layer;
    forming a third functional layer on the third insulating layer, a lateral area of the third functional layer being structured by recesses in such a way that a structured lateral area defines a movable structure, the first, second, and third insulating layers and the first and second functional layers each including a lateral area, which is situated beneath the structured lateral area of the third functional layer and corresponds to a perpendicular projection of the structured lateral area; and
    etching the first, second, and third insulating layers, the third insulating layer being completely removed in the lateral area of the third insulating layer, and the movable structure being exposed by the removal of the third insulating layer in the lateral area, the second insulating layer being at least partially removed in the lateral area, and the third insulating layer being at least partially removed in the lateral area;
    wherein all recesses of the first functional layer which are situated in the lateral area of first functional layer are formed by narrow trenches whose width is smaller than twice a perpendicular distance between the first and third functional layers, and
    wherein the first functional layer is formed in such a way that it includes at least one electrically insulated segment in the lateral area, which is separated from a remainder of the first functional layer by trenches.

2. The method as recited in claim 1, wherein a width of the trenches in the lateral area of the first functional layer is greater than half a thickness of the first functional layer.

3. The method as recited in claim 1, wherein the second functional layer is formed in such a way that it includes at least one first segment and one second segment, and the first and second segments are electrically insulated from one another, the first functional layer being formed in such a way that it includes a first electrically insulated segment and a second electrically insulated segment which are separated from one another and from a remainder of the functional layer by trenches, the first electrically insulated segment of the first functional layer being situated beneath the first segment of the second functional layer, and the second electrically insulated segment of the first functional layer being situated beneath the second segment of the second functional layer.

4. The method as recited in claim 1, wherein the first functional layer is formed in such a way that it includes a shielding segment in the lateral area, which is separated from a remainder of the first functional layer by trenches, the shielding segment being situated beneath a recess of the second functional layer and conductively connected to at least one segment of the second functional layer.

5. The method as recited in claim 1, wherein the first functional layer is formed in such a way that it includes a first and a second shielding segment in the lateral area, which are situated in surroundings beneath a recess of the second functional layer, the first shielding segment being conductively connected to a first segment of the second functional layer, and the second shielding segment being conductively connected to a second segment of the second functional layer.

6. The method as recited in claim 1, wherein the recesses in the second functional layer are formed by the following substeps:
    forming trenches in the second functional layer, which extend across the entire thickness of the second functional layer, the trenches subsequently being filled through the formation of a first auxiliary layer;
    forming etching accesses in the first auxiliary layer, which partially expose the second functional layer, subareas of the second functional layer being removed as a result of subsequent etching, and the etching accesses being closed by the third insulating layer prior to formation of the third functional layer, the first auxiliary layer being at least partially removed during the etching of the third insulating layer.

7. The method as recited in claim 3, wherein subareas of the first insulating layer and of the second insulating layer are removed during etching in such a way that a remaining subarea of the first insulating layer forms a base structure for the first insulated segment of the first functional layer, and a remaining subarea of the second insulating layer forms a base structure for a segment of the second functional layer.

8. The method as recited in claim 1, wherein at least one strip conductor is formed by the first functional layer and/or at least one detection electrode is formed by the third functional layer.

9. A microelectromechanical structure, comprising:
    a substrate; and
    a first, second, and third functional layer, the third functional layer including a structured lateral area which forms a movable structure, the first and second functional layers each including a lateral area, which is situated beneath the structured lateral area of the third functional layer and corresponds to a perpendicular projection of the structured lateral area;
    wherein all recesses of the first functional layer which are situated in the lateral area of the first functional layer are formed by narrow trenches whose width is smaller than twice a perpendicular distance between the first and third functional layers, the first functional layer in the lateral area including at least one electrically insulated segment which is separated from a remainder of the first functional layer by trenches.

10. The microelectromechanical structure as recited in claim 9, wherein the second functional layer includes at least one first and one second segment, and the first and second segments are electrically insulated from one another, the first functional layer includes a first and a second electrically insulated segment, which are separated from one another and from a remainder of the functional layer by trenches, the first electrically insulated segment of the first functional layer being situated beneath the first segment of the second functional layer, and the second electrically insulated segment of the first functional layer being situated beneath the second segment of the second functional layer.

\* \* \* \* \*